US010211030B2

(12) United States Patent
Wang et al.

(10) Patent No.: US 10,211,030 B2
(45) Date of Patent: Feb. 19, 2019

(54) SOURCE RF POWER SPLIT INNER COIL TO IMPROVE BCD AND ETCH DEPTH PERFORMANCE

(71) Applicant: Applied Materials, Inc., Santa Clara, CA (US)

(72) Inventors: Rongping Wang, Cupertino, CA (US); Ruizhe Ren, Shaanxi (CN); Jon C. Farr, Tempe, AZ (US); Chethan Mangalore, Bangalore (IN); Peter Demonte, Millbrae, CA (US); Parthiban Balakrishna, Bangalore (IN)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/104,461

(22) PCT Filed: Jun. 15, 2015

(86) PCT No.: PCT/CN2015/081502
§ 371 (c)(1),
(2) Date: Jun. 14, 2016

(87) PCT Pub. No.: WO2016/201612
PCT Pub. Date: Dec. 22, 2016

(65) Prior Publication Data
US 2017/0200585 A1     Jul. 13, 2017

(51) Int. Cl.
*H01F 27/28*     (2006.01)
*H01J 37/32*     (2006.01)

(52) U.S. Cl.
CPC .......... *H01J 37/3211* (2013.01); *H01F 27/28* (2013.01); *H01J 37/321* (2013.01); *H01J 37/32651* (2013.01); *H01J 2237/3341* (2013.01); *H01J 2237/3344* (2013.01)

(58) Field of Classification Search
CPC .......... H01J 37/3211; H01J 2237/3344; H01J 2237/3341; H01F 27/28
See application file for complete search history.

(56) References Cited

U.S. PATENT DOCUMENTS

| 5,753,044 A | * | 5/1998 | Hanawa | H01J 37/321 118/723 I |
| 6,694,915 B1 | * | 2/2004 | Holland | H01J 37/321 118/715 |
| 2005/0224182 A1 | | 10/2005 | Edamura et al. | |
| 2009/0314434 A1 | * | 12/2009 | Song | H01J 37/321 156/345.48 |

(Continued)

FOREIGN PATENT DOCUMENTS

CN     101543141 A     9/2009

OTHER PUBLICATIONS

International Search Report and Written Opinion, PCT/CN2015/081502, dated Mar. 3, 2016.

*Primary Examiner* — Jeffrie R Lund
*Assistant Examiner* — Mirza Israr Javed
(74) *Attorney, Agent, or Firm* — Patterson + Sheridan, LLP (57) ABSTRACT

Embodiments of the present disclosure include a radial frequency plasma source having a split type inner coil assembly. In one embodiment, the split type inner coil assembly comprises two intertwining coils. In another embodiment, the split type inner coil assembly includes looped coils forming a dome.

13 Claims, 5 Drawing Sheets

(56) References Cited

U.S. PATENT DOCUMENTS

2012/0090785 A1* 4/2012 Jang ................... H01J 37/3211
156/345.48
2014/0144584 A1* 5/2014 Koo, II ............. H01J 37/32091
156/345.48

* cited by examiner

SOURCE RF POWER SPLIT INNER COIL TO IMPROVE BCD AND ETCH DEPTH PERFORMANCE

BACKGROUND

Field

Embodiments of the present disclosure relate to apparatus and methods for processing semiconductor substrates. More particularly, embodiments of the present disclosure relate to apparatus and methods for providing RF (radio frequency) power to semiconductor processing chambers for deep trench and via etching in fabrication of Micro-Electro-Mechanical Systems (MEMS) devices and the like.

Description of the Related Art

The demand for advanced semiconductor devices, such as Micro-Electro-Mechanical Systems (MEMS) devices, has introduced new challenges for processing equipment companies. One challenge is providing equipment suitable for efficient plasma etching of materials utilized to fabricate MEMS structures. For example, processing equipment utilized for etching must be able to maintain good critical dimension (CD) control and mask selectivity in order to successfully manufacture MEMS structures on a commercially viable scale. Additionally, for MEMS structures intended for optical devices, the processing equipment must produce sufficiently smooth sidewalls to obtain performance goals.

Silicon is a material commonly used for MEMS structures. Silicon etching for MEMS fabrication is typically carried out in a deep reactive ion etch (DRIE) reactor. Typical DRIE reactors generally have a source RF power to excite gas discharges or plasma and create reactive ions in the processing chambers. However, conventional DRIE reactors cannot meet the increased demands for uniformity of critical dimension and uniformity of etch rate in high aspect ratio pattern etching processes for manufacturing MEMS devices.

Therefore, there is a need for a semiconductor processing chambers with improved uniformity.

SUMMARY

The present disclosure generally relates to apparatus and methods for symmetry in electrical field, gas flow and thermal distribution in a processing chamber to achieve process uniformity. Embodiment of the present disclosure includes a radial frequency plasma source having a split type inner coil assembly. In one embodiment, the split type inner coil assembly comprises two intertwining coils. In another embodiment, the split type inner coil assembly includes looped coils forming a dome.

One embodiment provides a coil assembly. The coil assembly includes two or more coils. Each of the two or more coils winds from a first end radially outward to a second end. The first ends of the two or more coils are joined together. The second ends of the two or more coils are positioned at equal intervals.

Another embodiment provides an etch reactor. The etch reactor includes a chamber body defining a process volume, and an inner coil assembly disposed over the chamber body. The inner coil assembly comprises two or more inner coils. Each of the two or more inner coils winds from a first end radially outward to a second end. The first ends of the two or more inner coils are joined together near a central axis of the chamber body. The second ends of the two or more coils are positioned at equal intervals.

Another embodiment provides a method for forming a trench. The method includes supplying an etching agent to an etch reactor, and generating a plasma in the etch reactor by supplying a radio frequency power to two or more coils connected to each other in parallel. Each of the two or more coils winds from a first end radially outward to a second end. The first ends of the two or more coils are joined together. The second ends of the two or more coils are positioned at equal Intervals.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to apparatus and methods for providing RF power to semiconductor processing chambers. More particularly, embodiments of the present disclosure relate to designs of RF power source with a split type coil assembly. The split type coil assembly includes two or more coils that are symmetrically arranged about a central axis of a process chamber. Each of the two more coils in the split type coil assembly may wind from a first end positioned near the central axis and a second end near an edge of the process chamber. In one embodiment, the split type coil assembly forms an intertwining intricate shaped coil loops that are conformal to a chamber dome. In one embodiment, the split type coil assembly includes an inner coil assembly and an outer coil assembly. In one embodiment, each coil in the split type coil assembly may be independently adjusted to allow independent control of plasma density. The split type coil assembly improves bottom critical dimension (BCD) and process uniformity across the entire substrate being processed. The split type coil assembly according to the present disclosure also reduces power loss to energetic charged particles and induced negative impacts to devices and process chamber hardware due to undesired capacitive coupling, therefore, improve power efficiency and hardware reliability.

Figure 1:
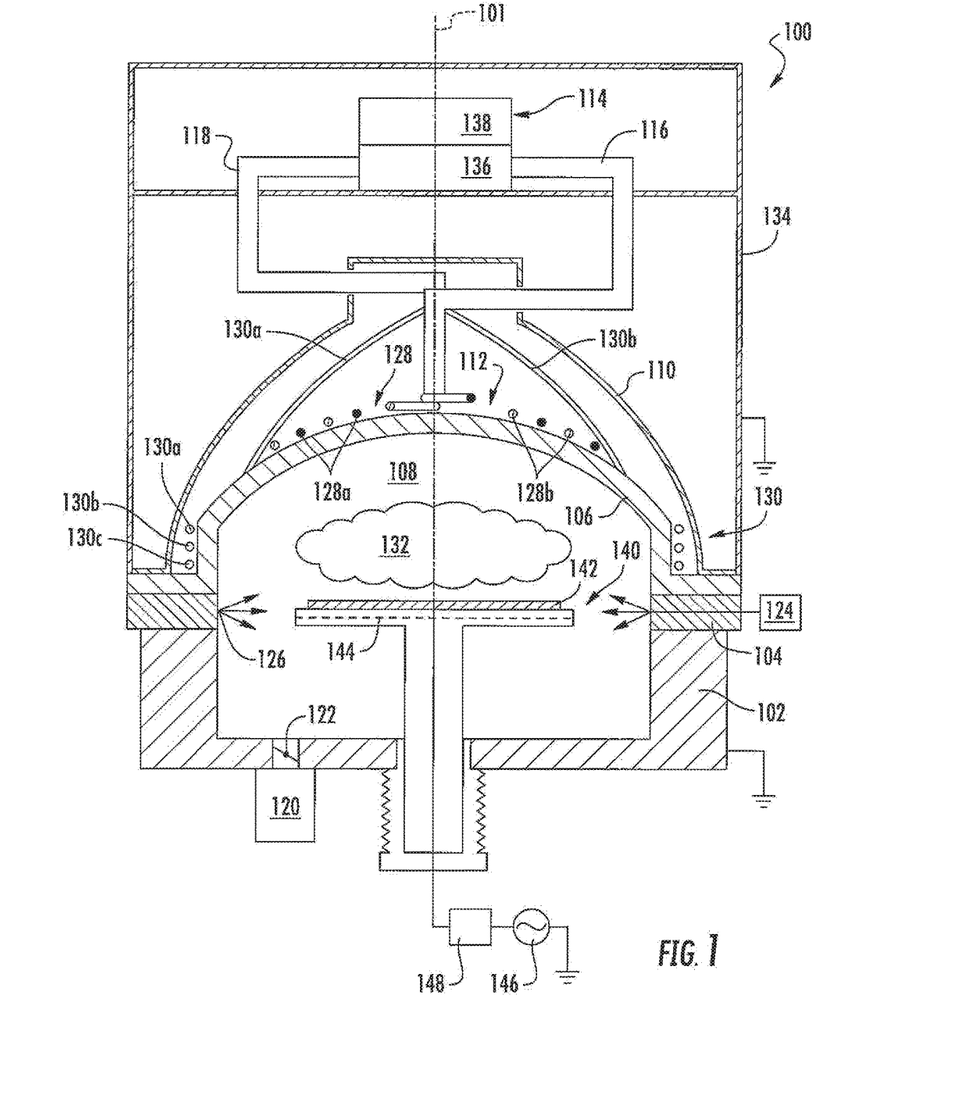
FIG. 1 depicts a schematic illustration of a plasma process chamber according to one embodiment of the present disclosure.

FIG. 1 is a sectional view of an etch reactor 100 according to one embodiment of the present disclosure. In one embodiment, the etch reactor 100 may be used to manufacture Micro-Electro-Mechanical Systems (MEMS) devices and the like.

The etch reactor 100 may include a lower chamber body 102 and an upper chamber body 104 disposed over the lower chamber body 102. A ceiling 106 may be disposed over the upper chamber body 104. The ceiling 106 may be made of a dielectric material. The lower chamber body 102, the upper chamber body 104, and the ceiling 106 may enclose a process volume 108. The ceiling 106 may be flat or have other geometry. In one embodiment, the ceiling 106 is a dome. A shield assembly 110 may be disposed over the calling 106.

An RF coil assembly 112 may be disposed between the ceiling 106 and the shied assembly 110. In one embodiment, the RF coil assembly 112 may include an inner coil assembly 128 and an outer coil assembly 130. According to the present disclosure, at least one of the inner coil assembly 128 and the outer coil assembly 130 includes two or more coils in parallel connections. The RF coil assembly 112 may be coupled to a power source 114 through connectors 116, 118. In one embodiment, the connectors 116, 118 may be conductive rods suitable for conducting RF currents. An outer cover 134 may be disposed over the shied assembly 110 and the power source 114. The power source 114 may include a RF source 138 and a matching network 136.

The ceiling 106 is transmissive to the RF power such that power applied to the RF coil assembly 112 may be inductively coupled to and energize gases disposed in the process volume 108 of the etch reactor 100 to maintain a plasma 132 therein. Conventionally, the power applied to the RF coil assembly 112 is known as source power. The source power may be provided by the RF source 138 at a radio frequency within a range from about 12 Mhz to about 13.5 MHz at a power within a range from about 10 watts to about 5000 watts. The source power may be pulsed.

The etch reactor 100 may include a gas exchange system 124 coupled thereto that provides process and/or other gases to the process volume 108 through nozzles 126 positioned around the interior of the upper chamber body 104 or other suitable location. The gas exchange system 124 selectively allows any singular gas or combination of gases to be provided to the process volume 108.

The etch reactor 100 may include a vacuum pump 120 to control the pressure within the process volume 108. The etch reactor 100 may also include a throttle valve 122 coupled between the pump 120 and the process volume 108.

The etch reactor 100 may further include a substrate support assembly 140 disposed in the process volume 108. The substrate support assembly 140 is configured to support a substrate 142 for processing. In one embodiment, the substrate support assembly 140 may include a bias electrode 144. The bias electrode 144 may be coupled to a bias RF source 146 through a bias matching network 148. A bias RF power may be applied to the bias electrode 144. The bias RF power serves to enhance the transport of plasma species in the plasma 132 to the surface of the substrate 142. In one embodiment, the bias RF power may be at a frequency less than 5 MHz. The bias RF power may be up to 10,000 watts.

According to embodiments of the present disclosure, the RF coil assembly 112 is a split type coil assembly. In one embodiment, the Inner coil assembly 128 includes two or more coils 128a, 128b. Each coil 128a, 128b winds from a center axis 101 radially outward towards an edge region of the etch reactor 100. In one embodiment, the coils 128a, 128b may intertwine with each other and form a circular shape conformal to the ceiling 106. In FIG. 1, the ceiling 106 has a dome shape, and the coils 128a, 128b form a dome shape above the ceiling 106. Alternatively, the coils 128a, 128b may form a planar shape over a flat ceiling. The coils 128a, 128b may be connected parallel to each other. The coils 128a, 128b may be connected to between the connection 116 and the outer cover 134. The outer cover 134 is connected to the RF ground. In one embodiment, the connectors 116 joins with the coils 128a, 128b near the central axis 101 to obtain symmetry.

In one embodiment, the outer coil assembly 130 may include two or more coils 130a, 130b, 130c. Each of the two or more coils 130a, 130b, 130c may be a single turn coil of the same diameter. In one embodiment, ends of the coils 130a, 130b, 130c may be arranged at equal intervals to enable a uniform RF field generation. Each coil 130a, 130b, 130c may have a first end extending to the connector 118 near the central axis 101 and a second end near the edge of the etch reactor 100.

In one embodiment, the connectors 116, 118 may be symmetrically disposed about the central axis 101 to improve symmetry of the etch reactor 100. For example, each connector 116, 118 may include a vertical section disposed near the central axis 101 to connect with the inner coil assembly 128 and the outer coil assembly 130, and a horizontal section extending toward the power source 114. The horizontal sections of the connectors 116, 118 are at the same horizontal level, of the same length but at about 180 degrees from each other.

Figure 2A:
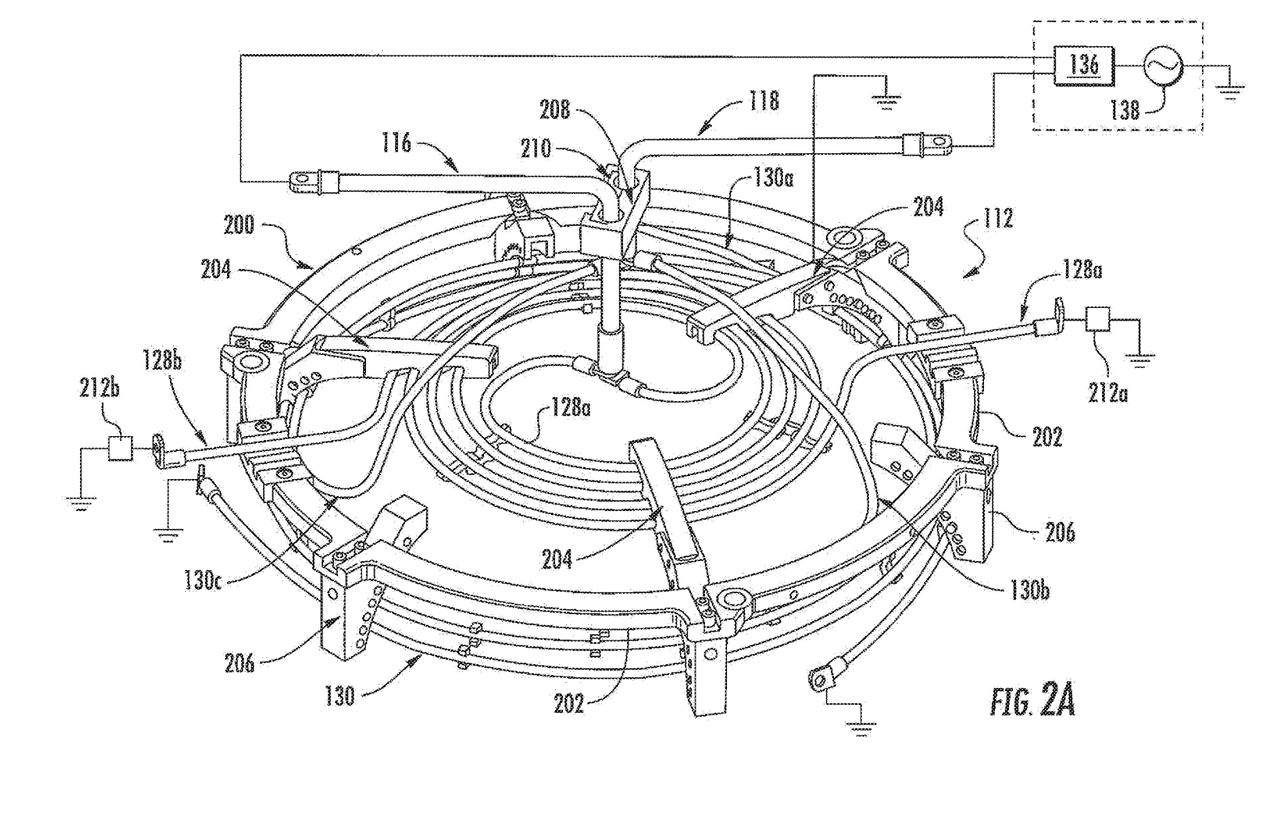
FIG. 2A is a schematic perspective view of a radio frequency (RF) source according to one embodiment of the present disclosure.

FIG. 2A is a schematic perspective view of a radio frequency (RF) source in the etch reactor 100. The coil assembly 112 may be secured by a ring assembly 200. The ring assembly 200 may include a base ring 202. A plurality of inner brackets 204 may be attached to the base ring 202. The plurality of inner brackets 204 may extend radially inward from the base ring 202. In one embodiment, the inner brackets 204 may be evenly distributed along the base ring 202. The inner coils 128a, 128b are secured to the inner brackets 204. The Inner brackets 204 maintain the winding of the inner coils 128a, 128b.

A plurality of outer brackets 206 may be attached to the base ring 202. The plurality of outer brackets 206 may be evenly distributed along the base ring 202. The outer coils 130a, 130b, 130c are secured to the outer brackets 206. The outer brackets 206 maintain the winding of the outer coils 130a, 130b, 130c.

Connector brackets 208, 210 may be used to secure the connectors 116, 118 in position. As shown in FIG. 2A, the connectors 116, 118 may be L-shaped rods. The connector brackets 208, 210 support the connectors 116, 118 and position the connectors 116, 118 substantially symmetrical to each other.

In one embodiment, the Inner coil assembly 128 and the outer coil assembly 130 may be connected to the same power source 138 through the matching network 136. In one embodiment, the power distribution between the inner coil assembly 128 and the outer coil assembly 130 may be adjusted to achieve desired RF power distribution in the process volume 108. For example, the power supplied to the outer coil assembly 130 may be Increased to increase etch rate near the edge region.

In one embodiment, a capacitor 212a, 212b is in series connection with the inner coil 128a, 128b respectively. The capacitor 212a, 212b may be connected between the inner coil 128a, 128b and the RF ground. In one embodiment, the capacitor 212a, 212b may be fixed capacitors. In another embodiment, the capacitor 212a, 212b may be variable capacitors adjustable independently to allow independent adjustment of a RF current flowing through each Inner coil 128a, 128b.

Figure 2B:
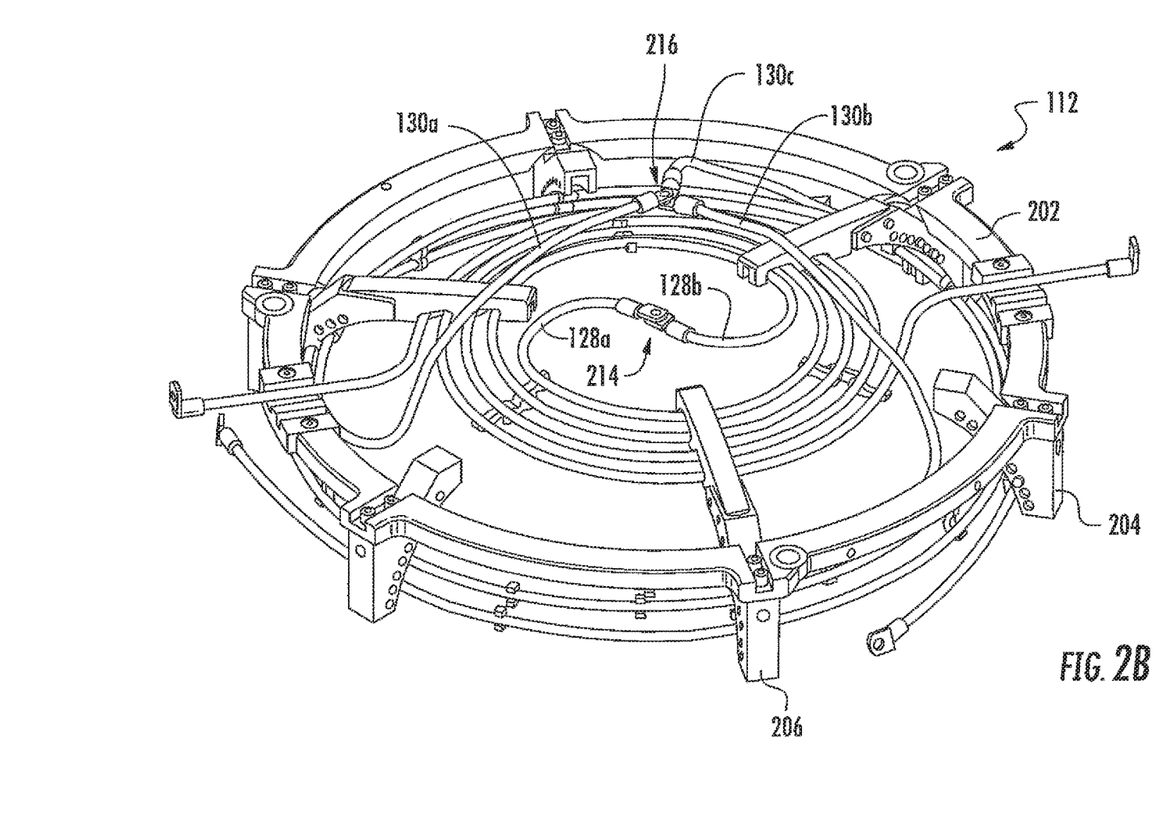
FIG. 2B is a schematic perspective view of a coil assembly in the radio frequency source of FIG. 2A.

FIG. 2B is a schematic perspective view of the coil assembly 112 without showing the connectors 116, 118. As shown in FIG. 2B, the inner coils 128a, 128b are connected at a common point 214 near the center of the coil assembly 112. The inner coils 128a, 128b are connected to the RF source at the common point 214. Similarly, the outer coils 130a, 130b, 130c are connected at a common point 214. The outer coils 130a, 130b, 130c are connected to the RF source at the common point 216.

Figure 3A:
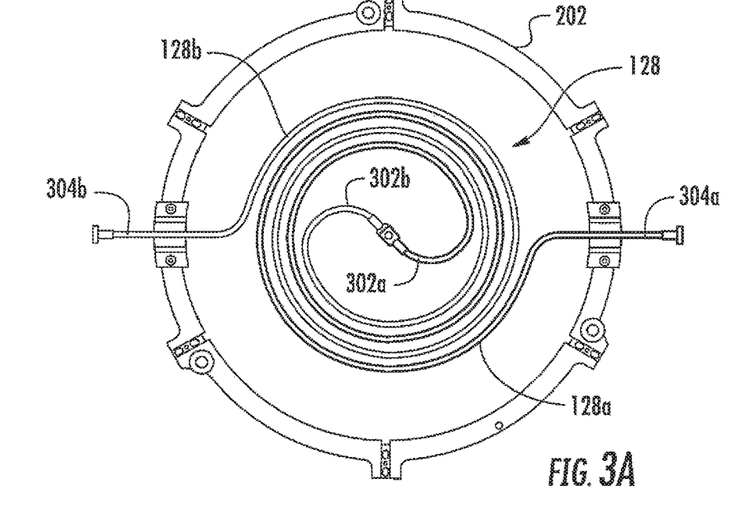
FIG. 3A is a schematic top view of an inner coil assembly according to one embodiment of the present disclosure.
Figure 3B:
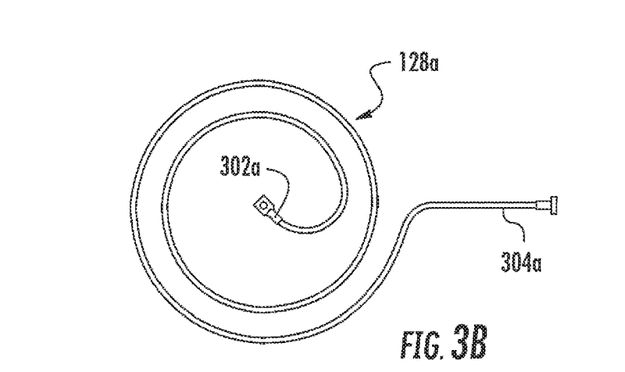
FIG. 3B is a top view of a first coil in the inner coil assembly of FIG. 3A.
Figure 3C:
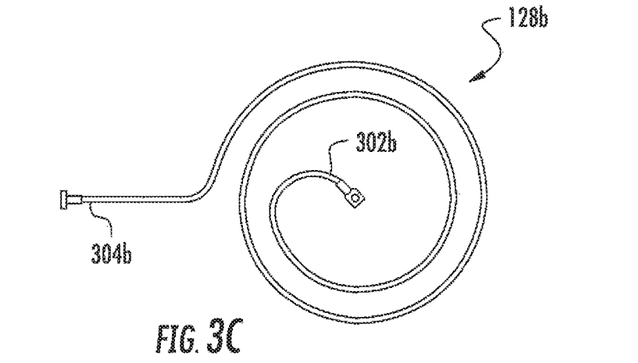
FIG. 3C is a top view of a second coil of the inner coil assembly of FIG. 3A.

FIG. 3A is a schematic top view of the inner coil assembly 128 according to one embodiment of the present disclosure. FIG. 3B is a top view of the first Inner coil 128a in the inner coil assembly of FIG. 3A. FIG. 3C is a top view of the second inner coil 128b of the inner coil assembly of FIG. 3A. The first and second inner coils 128a, 128b may have the same length. The first and second inner coils 128a, 128b may wound at the same shape from a center end 302a, 302b to an outer end 304a, 304b. The first and second inner coils 128a, 128b may be joined at the center ends 302a, 302b and disposed at 180 degrees from each other. In FIGS. 3A-3C, each inner coil 128a, 128b has about two turns. However, the inner coils 128a, 128b may include suitable amount of turns according to process requirement.

The first and second Inner coils 128a, 128b form a substantially symmetrical pattern, therefore, improving a uniformity of the inner coil assembly 128 compared with traditional coil assembly with a single coil. Compared to the traditional single coil assemblies, the split coil inner coil assembly 128 also Improves plasma efficiency. Efficiency of an inductive coupled plasma generator may be lowered because of power loss to copper and undesired capacitive coupling. Not Intent to be bound by theory, the amount of power loss to copper is proportional to the length of a single coil. The amount of undesired capacitive coupling increases quadratically to the number of turns in a coil. For example, the amount of power loss to capacitive coupling in a two turn coil is about four times as high as the amount of loss in a single turn coil. Each inner coil 128a, 128b shown in FIG. 2A-2C has two turns while the inner coil assembly 128 has four turns. Thus, the split coil type coil assembly allows the number of coil turns to increase, thus increase uniformity, without introducing additional power loss to capacitive coupling.

Figure 3D:
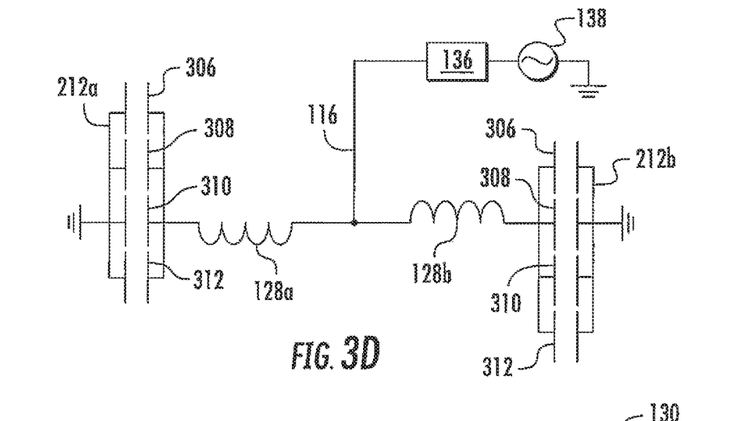
FIG. 3D is a schematic graph of an electric circuit of the inner coil assembly of FIG. 3A.

FIG. 3D is a schematic graph of an electric circuit of the inner coil assembly 128 of FIG. 3A. Each of the variable capacitor 212a, 212b may be a plurality of parallel capacitors 306, 308, 310, 312. The capacitance to the variable capacitor 212a, 212b may be adjusted by connecting different combinations of the capacitors 306, 308, 310, 312.

Even though, the inner coil assembly 128 includes two inner coils. Inner coil assembly according to the present disclosure may include two or more coils forming a symmetrical pattern. In one embodiment, the two or more coils may have the same length and wound at the same shape from a center end to an outer end. The two or more coils may be joined at the center ends and disposed at different angles so that the outer ends of the two or more coils are at angels of equal intervals.

Figures 4A, 4B:
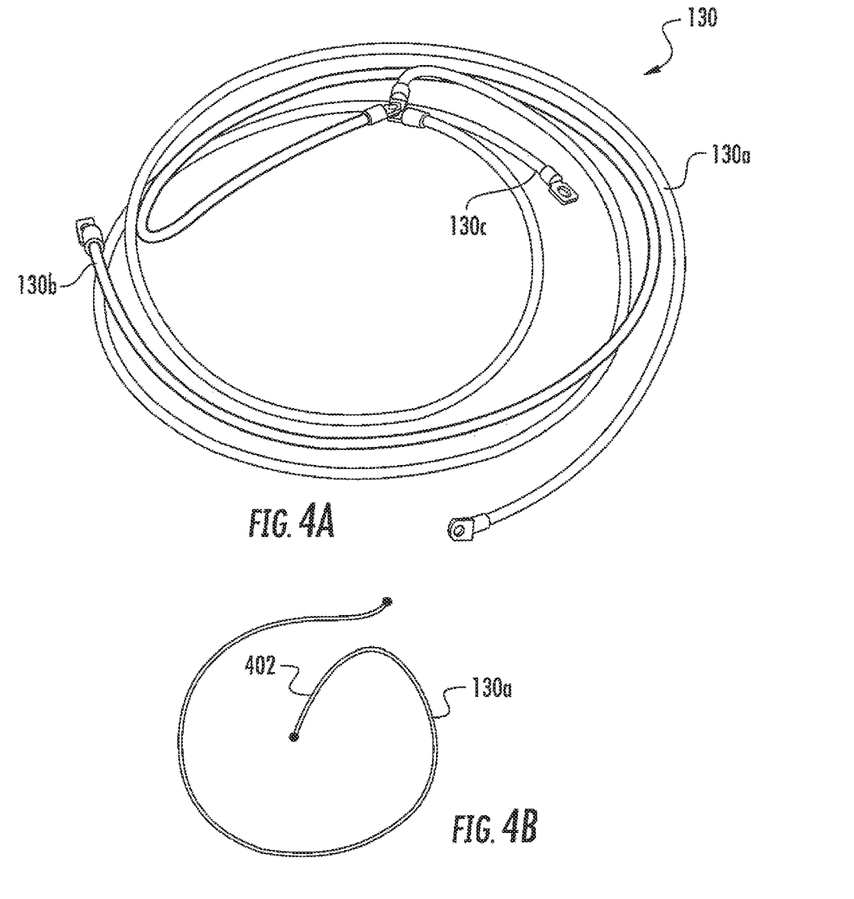
FIG. 4A is a schematic perspective view of an outer coil assembly according to one embodiment of the present disclosure.
FIG. 4B is a top view of a coil of the outer coil assembly of FIG. 4A.

FIG. 4A is a schematic perspective view of the outer coil assembly 130. FIG. 4B is a top view of one outer coil 130a of the outer coil assembly 130 of FIG. 4A. The outer coil assembly 130 includes three outer coils 130a, 130b, 130c arranged in a symmetrical pattern. The outer coils 130a, 130b, 130c may be of the same length. The outer coils 130a, 130b, 130c may be wound at the same shape. Each outer coil 130a, 130b, 130c may have a center end 402 to connect with the power source. The outer coils 130a, 130b, 130c may be joined at the center ends 402 and disposed at 120 degrees from each other. Each outer coil 130a, 130b, 130c is shown to have one turn in FIG. 4A. However, each outer coil 130a, 130b, 130c may have any suitable number of turns according to the process requirements.

Embodiments of the present disclosure Improve etch CD uniformity and etch rate uniformity, particularly during deep trench etching. The etch reactor 100 may be used to etch trenches from a broad range of applications with improved CD and etch rate uniformities. For example, for super junction etch, the etch reactor 100 may be used to etch trenches with a depth between about 50 microns to about 100 microns, and a width between about 0.5 micron to about 1.0 micron. The uniformity of critical dimension may be between about 2% to about 3% across the substrate. The etch rate variation between from the center to the edge is less than 1%.

The etch reactor 100 may be used to perform single-phase etching or cyclic etching. In single-phase etching, one or more etching gas may flow to the process volume 108 continuously until desired etch depth is reached. In cyclic etching, an etching agent and a passivation agent may be alternatingly delivered to the process volume 108 in pulses.

In one embodiment, the etch reactor 100 may be used to etch silicon by a cyclic etching process. During the above cyclic etching process, RF power may be provided to the Inner coil assembly 128 and the outer coil assembly 130 to generate a plasma in the process volume.

The cyclic etching process includes providing a fluorine-containing gas to the process volume 108. Suitable fluorine-containing gases include $SF_6$, $NF_3$, $CF_4$, $CHF_3$, $ClF_3$, $BrF_3$, $IF_3$, or derivatives thereof. The fluorine-containing gas may be supplied for a duration of less than about seven seconds. In one embodiment, the fluorine-containing gas may be supplied for a duration between about one to three seconds.

The cyclic etching process further Includes providing a polymer-forming gas to the process volume 108. The polymer-forming gas may include a carbon-containing gas such as $C_4F_8$. Other suitable polymer-forming gases may be utilized. The polymer-forming gas may be provided for a duration of less than about seven seconds. In one embodiment, the polymer-forming gas may be supplied for a duration between about one to three seconds.

In one embodiment, the cyclic etching process further includes flowing an oxygen-containing gas after providing the polymer-forming gas to etch polymer from the bottom, horizontal surfaces of the feature being etch to expose silicon material for subsequent etching with the flowing-containing gas.

While the foregoing is directed to embodiments of the present disclosure, other and further embodiments of the disclosure may be devised without departing from the basic scope thereof, and the scope thereof is determined by the claims that follow.

The invention claimed is:

1. A coil assembly, comprising:
an inner coil assembly comprising:
two or more inner coils that are intertwined and form a dome shape, wherein each of the two or more inner coils winds from a first end radially outward to a second end, the first ends of the two or more inner coils are connected in parallel, and the second ends of the two or more inner coils are positioned at equal intervals;
a first conductive rod having a vertical section disposed on a central axis common to the two or more inner coils, the vertical section is coupled to the first ends of the two or more inner coils connected in parallel; and
two or more capacitors, wherein each of the two or more capacitors is connected to a corresponding one of the two or more inner coils in series; and
an outer coil assembly comprising:
two or more outer coils that are intertwined and form the dome shape, wherein each of the two or more outer coils winds from a first end radially outward to a second end, the first ends of the two or more outer coils are connected in parallel, and the second ends of the two or more outer coils are positioned at equal intervals; and
a second conductive rod having a vertical section disposed adjacent to the central axis, the vertical section is coupled to the first ends of the two or more outer coils connected in parallel.

2. The coil assembly of claim 1, wherein each of the two or more inner coils has the same length.

3. The coil assembly of claim 2, wherein each of the two or more coils winds to the same shape.

4. The coil assembly of claim 1, wherein each of the two or more capacitors is connected between each of the two or more inner coils and a RF (radio frequency) ground.

5. The coil assembly of claim 1, wherein the first conductive rod and second conductive rod are substantially symmetrical to each other.

6. The coil assembly of claim 5, wherein the first conductive rod and the second conductive rod comprise second sections on a same level and positioned 180 degrees from each other.

7. The coil assembly of claim 1, wherein a power source is configured to provide independently adjustable power to each of the coils.

8. The coil assembly of claim 1, wherein each of the two or more capacitors is a variable capacitor having a plurality of parallel capacitors.

9. The coil assembly of claim 8, wherein the plurality of parallel capacitors have a different capacitance.

10. A method for forming a trench with the coil assembly of claim 1, comprising:
supplying an etching agent to an etch reactor, the etch reactor having the coil assembly; and
generating a plasma in the etch reactor by supplying a radio frequency power to the coil assembly, the supplying the radio frequency power to the coil assembly comprising:
supplying the radio frequency power to the inner coil assembly though the first conductive rod coupled to the two or more inner coils; and
supplying the radio frequency power to the outer coil assembly though the second conductive rod coupled to the two or more outer coils.

11. An etch reactor, comprising:
a chamber body defining a process volume, wherein the chamber body comprises a chamber lid; and
a coil assembly disposed over the chamber lid, wherein the coil assembly comprises:
an inner coil assembly comprising:
two or more inner coils that are intertwined and form a dome shape, wherein each of the two or more inner coils winds from a first end radially outward to a second end, the first ends of the two or more inner coils are connected in parallel, and the second ends of the two or more inner coils are positioned at equal intervals; and
a first conductive rod having a vertical section disposed on a central axis common to the two or more inner coils, the vertical section is coupled to the first ends of the two or more inner coils connected in parallel; and
an outer coil assembly comprising:
two or more outer coils that are intertwined and form the dome shape, wherein each of the two or more outer coils winds from a first end radially outward to a second end, the first ends of the two or more outer coils are connected in parallel, and the second ends of the two or more outer coils are positioned at equal intervals; and
a second conductive rod having a vertical section disposed adjacent to the central axis, the vertical section is coupled to the first ends of the two or more outer coils connected in parallel.

12. The etch reactor of claim 11, wherein in the chamber lid has the dome shape.

13. The coil assembly of claim 11, wherein the first conductive rod and second conductive rod are substantially symmetrical to each other.

* * * * *